(12) United States Patent
Fuertes Marón et al.

(10) Patent No.: US 8,334,154 B2
(45) Date of Patent: Dec. 18, 2012

(54) METHOD FOR THE PRODUCTION OF QUANTUM DOTS EMBEDDED IN A MATRIX, AND QUANTUM DOTS EMBEDDED IN A MATRIX PRODUCED USING THE METHOD

(75) Inventors: David Fuertes Marón, Madrid (ES); Sebastian Lehmann, Potsdam (DE); Sascha Sadewasser, Berlin (DE); Martha Christina Lux-Steiner, Berlin (DE)

(73) Assignee: Helmholtz-Zentrum Berlin Fuer Materialien und Energie GmbH, Berlin (DE)

( * ) Notice: Subject to any disclaimer, the term of this patent is extended or adjusted under 35 U.S.C. 154(b) by 819 days.

(21) Appl. No.: 12/519,357

(22) PCT Filed: Dec. 11, 2007

(86) PCT No.: PCT/DE2007/002230
§ 371 (c)(1),
(2), (4) Date: Jun. 15, 2009

(87) PCT Pub. No.: WO2008/074298
PCT Pub. Date: Jun. 26, 2008

(65) Prior Publication Data
US 2010/0108986 A1 May 6, 2010

(30) Foreign Application Priority Data
Dec. 16, 2006 (DE) .................. 10 2006 060 366

(51) Int. Cl.
*H01L 21/00* (2006.01)
(52) U.S. Cl. ............ 438/39; 438/47; 438/507; 438/509; 257/E21.097; 257/E21.108

(58) Field of Classification Search .............. None
See application file for complete search history.

(56) References Cited

U.S. PATENT DOCUMENTS

| | | | |
|---|---|---|---|
| 5,229,320 A | | 7/1993 | Ugajin et al. |
| 5,656,329 A | * | 8/1997 | Hampden-Smith et al. .. 427/226 |
| 5,906,670 A | * | 5/1999 | Dobson et al. ................. 75/370 |
| 5,965,212 A | * | 10/1999 | Dobson et al. ............... 427/469 |
| 6,242,326 B1 | | 6/2001 | Ro et al. |
| 2002/0153522 A1 | | 10/2002 | Park et al. |
| 2003/0116080 A1 | | 6/2003 | Huang |
| 2003/0129311 A1 | | 7/2003 | Huang |
| 2004/0092125 A1 | | 5/2004 | Kim et al. |
| 2004/0168626 A1 | | 9/2004 | Moeck et al. |

FOREIGN PATENT DOCUMENTS

| | | |
|---|---|---|
| DE | 69411945 | 11/1998 |
| DE | 60108913 | 1/2006 |
| JP | 2006080293 | 3/2006 |
| KR | 1020010054538 | 7/2001 |

OTHER PUBLICATIONS

International Search Report for PCT/DE2007/002230, mailed on Apr. 24, 2008.

\* cited by examiner

*Primary Examiner* — Zandra Smith
*Assistant Examiner* — Khanh Duong
(74) *Attorney, Agent, or Firm* — Leydig, Voit & Mayer, Ltd.

(57) ABSTRACT

A method for producing quantum dots embedded in a matrix on a substrate includes the steps of: depositing a precursor on the substrate, the precursor including at least one first metal or a metal compound; contacting the deposited precursor and uncovered areas of the substrate with a gas-phase reagent including at least one second metal and/or a chalcogen; and initiating a chemical reaction between the precursor and the reagent by raising a temperature thereof simultaneously with or subsequent to the contacting so that the matrix consists exclusively of elements of the reagent.

16 Claims, 1 Drawing Sheet

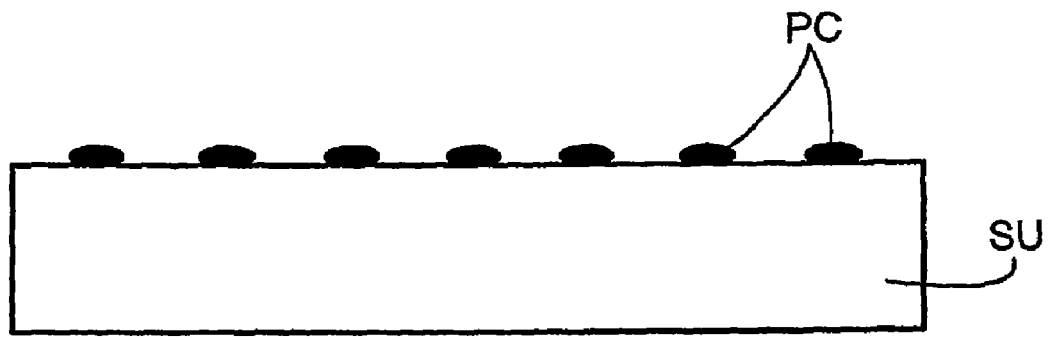
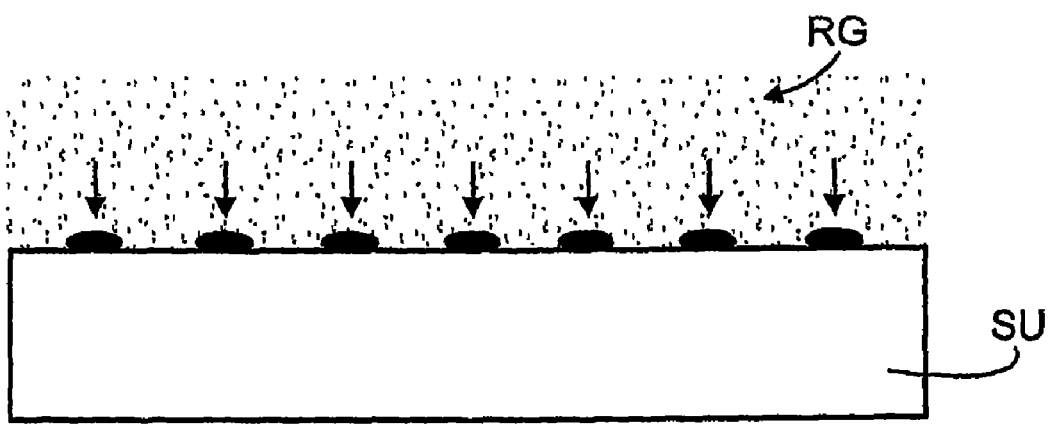
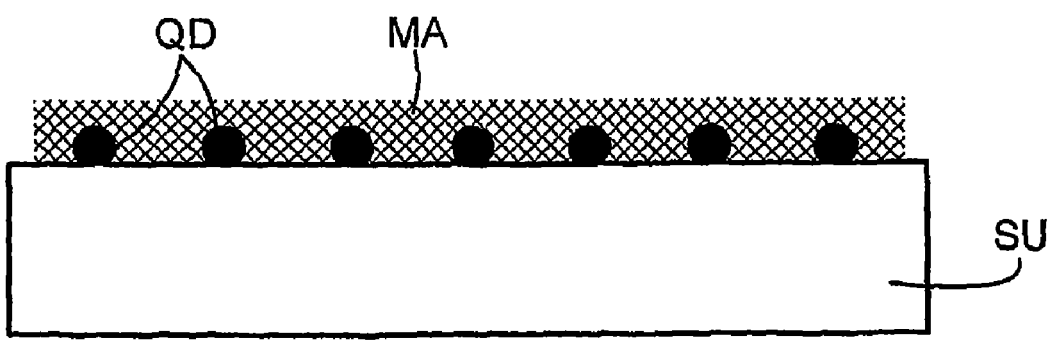

METHOD FOR THE PRODUCTION OF QUANTUM DOTS EMBEDDED IN A MATRIX, AND QUANTUM DOTS EMBEDDED IN A MATRIX PRODUCED USING THE METHOD

CROSS REFERENCE TO PRIOR APPLICATIONS

This application is a U.S. National Phase application under 35 U.S.C. §371 of International Application No. PCT/DE2007/002230, filed on Dec. 11, 2007 and claims benefit to German Patent Application No. DE 10 2006 060 366.4, filed on Dec. 16, 2006. The International Application was published in German on Jun. 26, 2008 as WO 2008/074298 under PCT Article 21(2).

FIELD

The present invention relates to a method for producing quantum dots embedded in a matrix on a substrate, and to quantum dots embedded in a matrix, produced using the method.

BACKGROUND

In objects having a size of only a few nanometers, which are known as quantum dots, nanodots, or nanoislands, the freedom of motion of the electrons is restricted in all three spatial directions ("zero-dimensional system"). Thus, the linear dimension in all three directions is less than the de Broglie wavelength of the charge carriers. Such quantum dots have a greatly modified electronic structure from the corresponding bulk semiconductor material and, in particular, the density of states becomes more like that for molecules. Quantum dots have a discrete energy spectrum and, in some aspects, behave similarly to atoms, which is due to the quantum nature of the electronic structure. However, unlike with atoms, it is possible to influence the size and electronic structure. Due to the small electrical capacitance of the quantum dots, the addition of a further electron to the electrons already present in the quantum dot ("single-electron tunneling") requires a certain amount of energy, ranging from several tens of meV to several hundreds of meV ("Coulomb blockade"). This effect allows for controlled quantization of the current flow through the quantum dot. The size and shape of the quantum dots are dependent on the production method and the elements used. At present, quantum dots are mainly used in nanooptics and nanoelectronics, for example, in photodetectors and semiconductor lasers, and also in solar cells. In particular, the formation of binary, ternary, or multinary compound semiconductor quantum structures in a semiconductor matrix is becoming increasingly important in the manufacture of efficient solar cells.

The most frequently used method for producing quantum dots is Stranski-Krastanov epitaxial growth, which is based on a strained crystal lattice of the semiconductor growing on the substrate. As a result of this lattice strain, the growing layer does not grow uniformly. Instead, small nanometer-sized islands are formed, which constitute the quantum dots. Using this method, the size and density of the quantum dots can be controlled to a certain degree, while control of the arrangement and position is possible only to a very limited extent. Other methods for producing quantum dots use the methodology of scanning probe microscopy. These methods allow excellent control over the size and position of the quantum dots. However, they are sequential methods, in which each quantum dot must be produced individually. Therefore, such methods can be used only to a limited extent for devices having a large number of quantum dots.

The in-situ creation of quantum dots in a matrix is described, for example, in U.S. 2004/0092125 A1. There, a dielectric precursor is coated onto a thin metal layer on a substrate and gradually heated, whereby the metal layer and the precursor are gradually stacked on each other, so that quantum dots are formed from the precursor in the metal layer. U.S. Pat. No. 6,242,326 B1 describes a method for producing quantum dots, in which GaAs quantum dots are formed from Ga droplets and coated with a passivation layer which is formed of a buffer layer and a barrier layer. A similar method is described in KR 1020010054538A. Japanese document JP 2006080293 A describes a method of self-organized formation of InAs quantum dots on a GaAs layer, the quantum dots being embedded in a GaAs matrix. Further, it is described in U.S. Pat. No. 5,229,320 to deposit quantum dots through a porous GaAs membrane on an AlGaAs substrate, and to subsequently grow a matrix of AlGaAs for embedding purposes. A method for manufacturing a polymer containing dispersed nanoparticles is described in DE 601 08 913 T2. In that approach, first a polymer precursor is deposited, on which nanoparticles are subsequently distributed as quantum dots. The polymer is cross-linked by application of heat, thereby embedding the quantum dots into the matrix.

DE 694 11 945 T2 describes a method in which, first, a soluble precursor of a metal or a metal compound is dissolved in a vaporizable solvent. Then, the dissolved precursor is sprayed onto a substrate as finely distributed, nanometer-sized droplets. Thus, in this known method, the structure and distribution of the quantum dots are no longer dependent on the material and the substrate. The relatively severe limitations of the epitaxial growth method do not occur. The deposited nanostructured precursor is then brought into contact with a chalcogen-containing reagent, so that a chemical reaction occurs at room temperature to form quantum dots of a desired material composition comprised of the precursor and the reagent. The solvent may be vaporized before, during or after the chemical reaction. A polymer is additionally added to the solvent, and serves primarily to coat the dissolved precursor in the solvent and to prevent the nanoparticles from agglomerating during spray deposition. In addition, the polymer is deposited on the substrate, forming a matrix in which the quantum dots are embedded. A polymer matrix of this kind which is made of a transparent plastic has a certain refractive index for optical applications and may be stacked with other polymer layers of different refractive indices. The polymer is not subjected to a chemical reaction; it does not interact with the reagent. Materials other than a polymer cannot be used in the known method to form the matrix, because the matrix formation is merely a secondary effect, the matrix being formed on the substrate as a simple precipitate. The main purpose of the polymer used is to prevent the dissolved precursor particles from agglomerating, and therefore, must have corresponding materials and properties.

Document U.S. 2003/0129311 A1 describes a method which is similar but in which first a porous template is formed. The pores of the polymer are subsequently filled with a precursor solution from which the quantum dots are then formed.

SUMMARY

An embodiment of the present invention provides a method for producing quantum dots embedded in a matrix on a substrate. The method includes the steps of:
(a) depositing a precursor on the substrate, the precursor including at least one first metal or a metal compound;

(b) contacting the deposited precursor and uncovered areas of the substrate with a gas-phase reagent including at least one second metal and/or a chalcogen; and (c) initiating a chemical reaction between the precursor and the reagent by raising a temperature thereof simultaneously with or subsequent to the contacting so that the matrix consists exclusively of elements of the reagent.

DETAILED DESCRIPTION

It is an aspect of the present invention to provide a method for producing quantum dots embedded in a matrix, which will allow polymer-free matrices to be produced in a controlled manner without impairing limitations to the method. The matrix composition may be selectable independently of the quantum dot properties, and can co-determine the material composition of the quantum dots, resulting in concordant compositions of the quantum dots and the matrix. Further, the production of the quantum dots is preferably independent of the severe limitations of the epitaxial growth method. In addition, the method is simple, inexpensive and rugged, and preferably enables the manufacture of compound semiconductor-based products which may be used, in particular, in solar cell technology.

In one embodiment, the present invention provides a method for producing quantum dots embedded in a matrix on a substrate. In this method, first, quantum dots are deposited on the substrate from a precursor of at least one first metal or a metal compound. In this process, the highly structured or nanostructured deposition may determine the geometry and density of the quantum dots. In this manner and through the selection of the precursor, the electronic properties of the quantum dots may be determined independently of the substrate, which allows for the use of a variety of different substrates, such as simple glass, metal-coated glass, monocrystalline wafers, polycrystalline layers, films. There is no coupling, for example, to strained lattice states in a crystalline substrate. The use of a precursor in the present invention eliminates the link between the final structure size and the self-organization of the quantum dots during the process. There are various known methods for depositing quantum dots, which will be mentioned further below.

In one embodiment, after deposition of the quantum dots, the quantum dots and the substrate regions which are not covered by the dots are brought into contact with a gas-phase reagent. This reagent can be comprised, for example, of at least one second metal and/or a chalcogen and can contain all elements of the matrix to be formed, while the matrix is preferably composed exclusively of elements of the reagent. The chemical reaction between the precursor and the reagent is brought about by raising the temperature simultaneously with or subsequent to said contact (annealing step). The contact between the reagent and the deposited quantum dots causes the precursor to undergo a chemical reaction leading to the final material composition of the quantum dots.

In regions where the reagent contacts the exposed substrate, a matrix may be formed from the elements of the reagent in a corresponding stoichiometric ratio. The matrix also deposits above the converted quantum dots, so that the quantum dots are completely embedded in the in-situ formed matrix after the reaction with the reagent is completed.

Thus, in one embodiment the method of the present invention enables quantum dots to be produced using elemental metals or metal compounds as a precursor in a gas-phase reaction with multinary or elemental chalcogens. In the method of the present invention, the gas-phase reaction step can serve simultaneously, i.e., in situ in one and the same method step, to grow the matrix in the preferred form from a binary, ternary or multinary compound semiconductor in which the quantum dots are embedded, also in the form of a compound semiconductor (having one or more metal components more than the matrix). The gas-phase reaction step may be carried out such that the precursor is reacted directly to form the final product, for example, by using increased process temperature, or such that this reaction is performed in a subsequent, separate annealing step. The structural, electronic and optical properties of the final product are determined by the dimensions of the precursor structure, the precursor elements used, and the elements used in the gas-phase reaction. There are various methods available for producing the precursor and for the gas-phase reaction.

The deposition of metallic precursors in the form of islands of desired dimensions, which are then converted preferably into semiconductor structures in the subsequent gas phase-based processing step, can be done using a variety of methods, such as evaporation, sputtering, lithographic processes, Focused Ion Beam, scanning probe microscopy-based methods, electrochemical deposition techniques, and the ILGAR and SILAR wet-chemical methods.

German document DE 694 11 945 T2 describes a method for depositing a dissolved precursor. This method can also be used in the present invention, provided that the precursor used is soluble. In a refinement, said method advantageously uses a liquid-phase precursor which is dissolved in a vaporizable solvent. The precursor/solvent mixture is then sprayed onto the substrate in the form of droplets using special nozzles, possibly while applying an electric field. In this process, care must be taken to prevent agglomeration of the precursor. In this invention, it is not possible to add polymers as a separating agent, because they would also be incorporated into the matrix, leading to unwanted effects. The solvent may be vaporized before, during or after the initiation of the chemical reaction between the precursor and the reagent, so that the final product of the quantum dots is obtained by a wet-chemical or a dry-chemical reaction.

In addition to depositing the precursor in dissolved form, a solid-phase precursor may also be used to advantage. This precursor is then deposited on the substrate in highly structured to nanostructured form using special yet simple methods. For example, a solid-phase precursor may be deposited on the substrate in the form of nanoparticles simply by sprinkling them thereon. The nanoparticles may also be selectively deposited using, for example, micromanipulators.

A similar variety of processes are available for the gas-phase reaction of the desired elements in the reagent with the metallic precursors. The method of the present invention preferably uses semiconducting elements. Depending on the desired final product, which generally contains at least one metal and/or a chalcogen, there are different combinations of elemental, binary, ternary or multinary metallic precursors available which can be reacted with corresponding elemental, binary, ternary or multinary chalcogenides in the reagent. Preferably, therefore, binary, ternary or multinary compound semiconductors are formed for the quantum structure and the matrix. Elements from groups I through VI are preferably used for this purpose.

While the structural, electronic and optical properties of the quantum structures, preferably compound semiconductor structures, produced are mainly dependent on the elements used in the precursors and the gas-phase reaction, additional, typical properties of quantum dots are to be expected due to their reduced, nanometer-scale size, said properties making the final product particularly interesting for practical application. These properties have also been reported for quantum dots grown using conventional methods.

Further, the above-described method for producing quantum dots embedded in a matrix may include an additional step in which a diffusion barrier or passivation layer is deposited on the deposited quantum dots to prevent the precursor elements from diffusing laterally out of the quantum dots, if this requirement must be met by the final device.

Thus, the method of the present invention enables quantum dots embedded in a matrix to be produced in a simple manner without limitations imposed by structures or materials, and is characterized by concordant compositions of the quantum dots and the matrix, the quantum dots having a composition obtained by addition of the elements of the precursor and of the reagent, and the matrix having a composition consisting exclusively of the elements of the reagent. The concordant compositions may preferably be based on binary, ternary and/or multinary semiconductor compounds.

To aid in the further understanding of the present invention, specific embodiments of the method for producing quantum dots embedded in a matrix on a substrate, and the product obtainable by this method, will now be described in greater detail with reference to synthesis examples and a diagrammatic FIGURE. The FIGURE shows the individual steps of the method according to the present invention.

The method is described by way of example for quantum dots QD grown from ternary or multinary compound semiconductors of the chalcopyrite family $(Na,Cu,Ag)(Al,Ga,In,Tl)(S,Se,Te)_2$ or, more generally, $I-III-VI_2$ compounds, and for simple binary compounds of the type I-VI, $I_2$-VI, III-VI, $III_2-VI_3$ etc., such as, for example, $CuS$, $Cu_2S$, $Ga_2Se_3$, $GaSe$, and is similarly applicable to compounds containing III-V, II-VI and group-IV elements.

In the following example, where ternary and multinary compounds are concerned, precursor PC is formed of elements of group I, group III, or type I-III alloys, which are deposited on a substrate SU using a suitable method (see above), and are then exposed to a gas atmosphere of reagent RG during a subsequent annealing step. Reagent RG contains one or more chalcogens and the metals that are not present in precursor PC but are intended to be contained in the finished quantum dot QD. In the exemplary embodiment, dry precursor PC is deposited on substrate SU in the form of nanometer-sized islands; i.e. in highly structured form. The final size of quantum dots QD made from the binary, ternary or multinary compound may generally differ from the size of the precursor islands and is dependent on the diffusion process of the various elements involved under the conditions present during the gas-phase reaction step. Depending on these reaction conditions, the final structure may have smaller or larger dimensions than the originally deposited precursor islands.

Example (I)

Ternary $CuGaSe_2$ Quantum Dots of Elemental Cu in a $Ga_2Se_3$ Matrix

Initially, metallic dots of Cu as the precursor PC having lateral and vertical dimensions in the nanometer range are deposited on a substrate SU of glass (non-conductive) or of molybdenum-coated glass (conductive). The deposition of precursor PC is done by evaporation using a suitable mask for nanopatterning the metal being deposited. However, the deposition can also be done using physical vapor deposition, molecular beam epitaxy, chemical transport methods (chemical vapor deposition, metal-organic chemical vapor deposition, etc.), or chemical or electrochemical methods (SILAR, ILGAR, electrodeposition, chemical bath deposition, etc.). Substrate SU, together with metal precursors PC, is then subjected to an annealing step, which allows reaction with gaseous reagent RG which, in this case, contains Ga and Se. Depending on the temperature and other process parameters, such as time and pressure, the gaseous components react with the Cu, forming the ternary compound $CuGaSe_2$ in the form of nanometer-sized quantum dots. The process parameters are selected such that these ternary quantum dots are formed in a matrix of a binary compound $(Ga_2Se_3)$, which is deposited simultaneously with the reaction that forms the ternary quantum dots (see the FIGURE). In the process, matrix MA initially deposits on substrate SU, and then also on the converted quantum dots QD, so that quantum dots QD are finally embedded in matrix MA. The process kinetics determining the size and shape of the resulting nano-sized structures can be controlled by the process parameters, which include, inter alia, the process temperature, the saturation conditions in the gas phase at the corresponding substrate temperature, and the duration of the process.

Example (II)

Pentanary $Cu(In,Ga)(S,Se)_2$ Quantum Dots of a CuGa Alloy in an $In_2(Se,S)_3$ Matrix In this example, precursor PC is formed of a metallic alloy of Cu and Ga of desired composition. The precursor is produced using the methods described above and is then subjected to an annealing step using In, Se and S as reagent RG in the gas phase. The reaction kinetics is controlled in the manner described hereinbefore. Quantum dots QD of $Cu(In,Ga)(Se,S)_2$ are formed in a matrix MA of $In_2(Se,S)_3$.

Example (III)

Multinary $I-III-VI_2$ Quantum Dots Made from Metallic Precursors Using Chemical Reagent Transport In this example, precursor PC is formed either of islands of group I or group III elements, or of alloys of group I or group III elements, or of type I-III alloys or islands, which are then subjected to an annealing step in the presence of the desired chalcogen and the additionally needed metals that are not present in the precursor, the annealing step being carried out by means of chemical vapor transport. In this process, for example, metal halides, organometallic compounds, and chalcogen halide are used, such as in a conventional chemical or metal-organic chemical vapor deposition process. Simultaneously with the formation of quantum dots QD, a matrix MA is formed on substrate SU from the desired chalcogen and the additionally needed metals that are not present in the precursor.

A halide is a binary compound, of which one part is a halogen atom and the other part is an element or radical that is less electronegative than the halogen. The salt-forming halogens F, Cl, Br, I respectively form fluorides, chlorides, bromides and iodides. When using metals or chalcogens as partners, metal halides or chalcogen halides are formed, respectively. Metal halides are used in particular in lighting engineering. Organometallic compounds are compounds in which an organic group, or an organic compound, is bonded directly to a metal atom. For the purposes of the present invention, it is possible to use, in particular, all metal halides, organometallic compounds, and chalcogen halides that are known in the art for use in a conventional chemical or metal-organic chemical vapor deposition process.

Example (IV)

Multinary I-III-VI$_2$ Quantum Dots Made from Metallic Precursors Using Chemical Reagent Transport and Having Magnetic Properties In this example, precursor PC is formed of metals, as described above, but with magnetic elements, such as Mn or Fe, being admixed to these metals in a certain amount of a few percent or more. The annealing step is carried out in the manner described hereinbefore. The composition of matrix MA does not differ from what was described hereinbefore. The magnetization is carried out only in the region of quantum dots QD.

Details of the Examples Illustrated:
Process Parameters of the Precursor:
mask opening <0.5 mm down to the lithographic limit
$T_{source}$ (Cu)>1000° C.
$T_{substrate}$ (glass) 25° C.
pressure $1\times10^{-4}$ Pa
deposition time <10 s
Process Parameters of the Reagent.
for CVD deposition of quantum dots of CuInS$_2$, CuGaS$_2$, CuGaSe$_2$, Cu(In,Ga)(S,Se)$_2$ in a
III$_2$VI$_3$ matrix
$T_{source}$ (III$_2$VI$_3$) 600° C.
$T_{substrate}$ 520° C.
pressure 10000 Pa
HCl gas flow (transport) 160 ml/min
H$_2$ gas flow (carrier) 460 ml/min
precipitation time 10 min
for the MBE process for the Ga$_2$Se$_3$ matrix
$T_{source}$ (Ga) 920° C.
$T_{source}$ (Se) 200° C.
$T_{substrate}$ 450° C.
pressure $2\times10^{-6}$ Pa
precipitation time 105 min General information on typical parameters for the growth of quantum dots QD embedded in a matrix MA Process pressure: from UHV ($10^{-6}$ mbar or less) in evaporation-based systems (PVD, MBE), low pressures ($10^{-1}$ to $10^2$ mbar) in systems based on chemical transport, ambient pressure or higher in electrodeposition.

Process temperature: Depending on the type of metallic precursor used, ~300° C. and higher for Cu—Al—Na-based precursors PC; ambient temperature and higher for In—Ga-based precursors PC. Upper temperature limits are determined by the type of the substrate SU used: ~600° C. for standard glass, above 1000° C. for metal films, from below 250 to 300° C. for plastic substrates. The chemical reaction for elements such as Cu, In and Se occurs exothermically, so that a process temperature of room temperature is sufficient here.

Process time: The process time is dependent on the deposition and process technology. The deposition of precursor PC can be accomplished within a few seconds. The simultaneous or subsequent heating process (without heating-cooling cycles) may last from a few seconds to hours (depending on the desired material composition of quantum dots QD and the layer thickness of matrix MA).

Material quality and element purity: Although theoretically the proposed method is not affected by the inclusion of impurities in terms of concentration and doping level, it may be necessary to determine certain limits for the purity of the elements involved in the process in order to achieve the functionality and electro-optical properties of the final structure.

The present invention is not limited to exemplary embodiments described herein; reference should be had to the appended claims.

LIST OF REFERENCE CHARACTERS

MA matrix
PC precursor
QD quantum dot
RG reagent
SU substrate

What is claimed is:

1. A method for producing quantum dots embedded in a matrix on a substrate comprising the steps of:
    (a) depositing a precursor on the substrate, the precursor comprising at least one first metal or a metal compound;
    (b) contacting the deposited precursor and uncovered areas of the substrate with a gas-phase reagent comprising at least one second metal and/or a chalcogen; and
    (c) initiating a chemical reaction between the precursor and the reagent by raising a temperature thereof simultaneously with or subsequent to the contacting so that the matrix consists exclusively of elements of the reagent.

2. The method of claim 1, wherein the precursor is in liquid-phase and the precursor is dissolved in a vaporizable solvent, and wherein the depositing the precursor is performed by spraying the vaporizable solvent onto the substrate in the form of droplets so that the vaporized solvent is vaporized before, during or after the initiation of the chemical reaction between the precursor and the reagent.

3. The method of claim 1 wherein the precursor is in solid-phase, and wherein the depositing the precursor is performed so as to deposit the precursor on the substrate in highly structured to nanostructured form.

4. The method of claim 1 wherein the precursor and the reagent respectively comprise at least one element selected from the group I, II, III, IV, V and VI elements.

5. The method as recited in claim 4, wherein the precursor and the reagent comprise a respective semiconducting element.

6. The method of claim 1 further comprising the step of admixing a magnetic element to the precursor.

7. The method of claim 1, further comprising the step of admixing metal halides, organometallic compounds, and/or chalcogen halides to the reagent.

8. The method of claim 1, further comprising the step of depositing a diffusion barrier or a passivation layer on the quantum dots.

9. The method of claim 4 further comprising the step of admixing a magnetic element to the precursor.

10. The method of claim 5 further comprising the step of admixing a magnetic element to the precursor.

11. The method of claim 4 further comprising the step of admixing metal halides, organometallic compounds, and/or chalcogen halides to the reagent.

12. The method of claim 5 further comprising the step of admixing metal halides, organometallic compounds, and/or chalcogen halides to the reagent.

13. The method of claim 4 further comprising the step of depositing a diffusion barrier or a passivation layer on the quantum dots.

14. The method of claim 5 further comprising the step of depositing a diffusion barrier or a passivation layer on the quantum dots.

15. Quantum dots embedded in a matrix produced using the method according to claim 1, wherein the quantum dots and the matrix have concordant compositions, and wherein the quantum dots have a composition of an addition of the elements of the precursor and of the reagent.

16. The quantum dots embedded in a matrix according to claim 15 wherein the concordant compositions are based on binary, ternary and/or multinary semiconductor compounds.

* * * * *